(12) United States Patent
Rančić et al.

(10) Patent No.: US 10,999,954 B2
(45) Date of Patent: May 4, 2021

(54) MODULAR ROOF MOUNTED COOLING SYSTEM AND METHOD FOR DATA CENTER

(71) Applicant: Vertiv Corporation, Columbus, OH (US)

(72) Inventors: Denis Rančić, Samobor (HR); Zvonimir Janković, Zagreb (HR); Željko Gjuranić, Zagreb (HR); Karlo Božo Raić, Sveti Ivan Zelina (HR)

(73) Assignee: Vertiv Corporation, Columbus, OH (US)

( * ) Notice: Subject to any disclaimer, the term of this patent is extended or adjusted under 35 U.S.C. 154(b) by 0 days.

(21) Appl. No.: 16/392,199

(22) Filed: Apr. 23, 2019

(65) Prior Publication Data

US 2020/0344916 A1    Oct. 29, 2020

(51) Int. Cl.
*H05K 7/20*   (2006.01)
*E04H 5/00*   (2006.01)
*H05K 7/14*   (2006.01)

(52) U.S. Cl.
CPC .......... *H05K 7/20745* (2013.01); *E04H 5/00* (2013.01); *H05K 7/1497* (2013.01);
(Continued)

(58) Field of Classification Search
CPC ............. H05K 7/20745; H05K 7/1497; H05K 7/20827; H05K 7/202; H05K 7/206;
(Continued)

(56) References Cited

U.S. PATENT DOCUMENTS 6,859,366 B2   2/2005   Fink
7,259,963 B2   8/2007   Germagian et al.
(Continued)

FOREIGN PATENT DOCUMENTS

CN   108036459 A   5/2018
EP     255604 A1   2/1988
(Continued)

OTHER PUBLICATIONS

Grabon Michel, Josserand Oliver, Schmid Jacques Rene, Terraz Gregory, "Data Center Cooling", Dec. 12, 2012, Carrier Corp, Entire Document (Translation of EP 2532217) (of record, cited in IDS). (Year: 2012).*
(Continued)

*Primary Examiner* — Stephen S Sul
(74) *Attorney, Agent, or Firm* — Harness, Dickey & Pierce, P.L.C.

(57) ABSTRACT

The present disclosure relates to a roof mounted modular cooling unit ("RMC unit") which is adapted for use above a unit IT structure being used to help form a data center. The RMC unit has a housing configured to be secured perpendicularly relative to a longitudinal axis of a frame of a modular unit IT structure. The housing has a cold air discharge compartment at one end thereof, overlaying a cold aisle formed within the unit IT structure, from which cold air from the modular cooling unit is discharged into the cold aisle, and a hot air intake compartment selectively located to overlay the hot aisle, into which hot air from the hot aisle is drawn. A width of the RMC unit is sufficient to substantially span a full width of the one of the equipment racks.

17 Claims, 6 Drawing Sheets

(52) U.S. Cl.
CPC ....... *H05K 7/2059* (2013.01); *H05K 7/20827* (2013.01); *E04H 2005/005* (2013.01)

(58) Field of Classification Search
CPC .. H05K 7/20609; H05K 7/20754; E04H 5/00; E04H 2005/005
USPC .................................................. 361/695, 696
See application file for complete search history.

(56) References Cited

U.S. PATENT DOCUMENTS

| | | | |
|---|---|---|---|
| 7,881,910 | B2 | 2/2011 | Rasmussen et al. |
| 7,944,692 | B2 | 5/2011 | Grantham et al. |
| 7,992,402 | B2 | 8/2011 | VanGilder et al. |
| 8,031,468 | B2 | 10/2011 | Bean, Jr. et al. |
| 8,145,363 | B2 | 3/2012 | Bean, Jr. et al. |
| 8,157,626 | B2 | 4/2012 | Day |
| 8,180,495 | B1 | 5/2012 | Roy |
| 8,193,448 | B2 | 6/2012 | Syed |
| 8,209,056 | B2 | 6/2012 | Rasmussen et al. |
| 8,327,656 | B2 | 12/2012 | Tutunoglu et al. |
| 8,353,492 | B2 | 1/2013 | Mattlin et al. |
| 8,355,890 | B2 | 1/2013 | VanGilder et al. |
| 8,360,833 | B2 | 1/2013 | Grantham |
| 8,544,289 | B2 | 10/2013 | Johnson et al. |
| 8,949,053 | B2 | 2/2015 | Ware |
| 8,972,217 | B2 | 3/2015 | VanGilder et al. |
| 8,973,380 | B2 | 3/2015 | Bean, Jr. et al. |
| 9,043,173 | B2 | 5/2015 | Lehmann et al. |
| 9,101,080 | B2 | 8/2015 | Czamara et al. |
| 9,228,336 | B2 | 1/2016 | Stauder |
| 9,337,688 | B2 | 5/2016 | Englert et al. |
| 9,451,731 | B2 | 9/2016 | Rasmussen et al. |
| 9,565,783 | B1 | 2/2017 | Whitted et al. |
| 9,629,285 | B1* | 4/2017 | Lachapelle ........ H05K 7/20745 |
| 9,790,701 | B2 | 10/2017 | Ziegler |
| 9,845,977 | B2 | 12/2017 | Bean, Jr. et al. |
| 9,913,407 | B2* | 3/2018 | Parizeau ............. H05K 7/2079 |
| 10,271,462 | B1* | 4/2019 | Ross .................. H05K 7/20827 |
| 10,716,236 | B2* | 7/2020 | Malone ............. H05K 7/20736 |
| 2008/0041077 | A1 | 2/2008 | Tutunoglu |
| 2009/0138313 | A1 | 5/2009 | Morgan et al. |
| 2010/0300650 | A1* | 12/2010 | Bean, Jr. ............ H05K 7/20827 165/67 |
| 2010/0307716 | A1* | 12/2010 | Bean, Jr. ............ H05K 7/20827 165/80.2 |
| 2011/0307102 | A1 | 12/2011 | Czamara |
| 2012/0063082 | A1 | 3/2012 | Chang et al. |
| 2012/0211198 | A1* | 8/2012 | Kinkel .................. F24F 1/0007 165/104.14 |
| 2013/0016472 | A1 | 1/2013 | Huettner et al. |
| 2013/0081784 | A1* | 4/2013 | Faig Palomer .... H05K 7/20745 165/80.2 |
| 2013/0107448 | A1 | 5/2013 | Hamburgen et al. |
| 2014/0059945 | A1* | 3/2014 | Gardner ............. E04B 1/34357 52/64 |
| 2014/0059946 | A1* | 3/2014 | Gardner ............. E04B 1/34384 52/64 |
| 2014/0298839 | A1* | 10/2014 | Nagamatsu ........ H05K 7/20209 62/186 |
| 2014/0355203 | A1* | 12/2014 | Kondo ............... H05K 7/20836 361/679.51 |
| 2015/0208553 | A1* | 7/2015 | Bauchot ................... F24F 11/30 361/679.47 |
| 2016/0037685 | A1* | 2/2016 | Ross ...................... H05K 7/208 165/104.19 |
| 2017/0354064 | A1 | 12/2017 | Milek et al. |
| 2019/0124796 | A1* | 4/2019 | Lin ....................... F24F 12/006 |
| 2019/0235449 | A1* | 8/2019 | Slessman .............. G06F 9/5094 |
| 2020/0080787 | A1* | 3/2020 | Fisher ................ H05K 7/20745 |

FOREIGN PATENT DOCUMENTS

| | | | |
|---|---|---|---|
| EP | 2532217 A1 * | 12/2012 | .......... H05K 7/20836 |
| IN | 7294/DELNP/2009 | 6/2010 | |
| IN | 0046/CHENP/2011 | 9/2011 | |
| IN | 8828/DELNP/2010 | 3/2012 | |
| IN | 3486/CHENP/2011 | 9/2012 | |
| IN | 0175/CHENP/2012 | 3/2013 | |
| IN | 9077/CHENP/2011 | 3/2013 | |
| IN | 9500/CHENP/2011 | 3/2013 | |
| IN | 9507/CHENP/2011 | 3/2013 | |
| IN | 9555/CHENP/2011 | 3/2013 | |
| IN | 9888/CHENP/2011 | 4/2013 | |
| IN | 4515/CHENP/2012 | 8/2013 | |
| IN | 9381/CHENP/2012 | 6/2014 | |
| IN | 1371/CHENP/2014 | 7/2016 | |
| IN | 0008/CHENP/2013 | 8/2016 | |

OTHER PUBLICATIONS

International Search Report and Written Opinion regarding International Application No. PCT/US2019/031491, dated Jan. 27, 2020.

* cited by examiner

MODULAR ROOF MOUNTED COOLING SYSTEM AND METHOD FOR DATA CENTER

FIELD

The present disclosure relates to modular data center systems and methods, and more particularly to a modular roof mountable cooling system which eliminates the need for separate air channeling duct work, as well as a separate ceiling, above equipment racks positioned within a data center equipment rack aisle.

BACKGROUND

The statements in this section merely provide background information related to the present disclosure and may not constitute prior art.

The use of modular data centers is growing rapidly around the world. With the growing use of micro data centers, this trend is expected to broaden. Such modular data structures form components which include the frame construction to form independent data center "modules" which are easily transported to a site where the data center is to be located. The data center modules may then be quickly and easily assembled together at the site to form a data center of desired dimensions and having a desired equipment capacity. This differs significantly from the traditional method of constructing data centers, where the underlying steel frame structure of the building, all of its walls, and all related heating/cooling and electrical components need to be fully assembled, piece by piece, at the work site. The use of a modular data center can dramatically expedite the construction of a fully up-and-running data center.

With many present day data centers, the cooling units employed are often located on a floor surface at one end of an equipment aisle. Each equipment aisle contains a row of equipment racks arranged in side-by-side fashion. The front sides of the equipment racks are open to an aisleway in which cold air is supplied by the cooling unit and which is typically referred to in the industry as a "cold aisle". Cold air is typically forced down the full length of the cold aisle and is drawn into and through each of the equipment racks by fans mounted inside the components mounted in the equipment racks. The cold air flowing into and through the equipment racks cools the various components located in each equipment rack. The rear sides of the racks collectively open into an aisleway termed in the industry as the "hot aisle". Warm air exhausted from the equipment racks flows into the hot aisle and is channeled into hot air ductwork, typically above the hot aisle, and forced by one or more fans back toward the cooling units at the opposite end of the equipment aisle. The warm air is received by the cooling units, which cool the air and then discharge cold air back down the cold aisle.

The use of cooling units which are located at one end of the hot/cold aisles requires the data center to have an overall larger footprint to accommodate the floor supported cooling units. The ductwork needed to channel the hot air fully along the lengths of the equipment aisles also represents a significant added expense for the data center construction. The need to deploy additional cooling units at one end of the hot/cold aisles also may restrict expanding the length of the hot/cold aisles, in the event additional capacity needs to be provided after the data center is initially designed and constructed. This is because adding additional floor mounted cooling units may require significantly expanding the footprint of the data center to accommodate the additional needed cooling units. Still further, the use of a conventional cold aisle and hot aisle also necessitates the use of a separate roof structure to cover the cold aisle ceiling area.

Accordingly, there is still a need for a modular data center unit which is even more space efficient in its deployment of cooling units, and which allows future expansion of a data center without imposing the space restrictions typically seen with traditional cooling units. There is also a need for a cooling unit which is sufficiently compact to be shipped physically attached to a modular data center unit, and thus does not need to be shipped separately or handled separately at the site during construction of the data center.

SUMMARY

This section provides a general summary of the disclosure, and is not a comprehensive disclosure of its full scope or all of its features. In one aspect the present disclosure relates to a modular cooling unit. The modular cooling unit is adapted for use above a unit IT structure forming a data center hallway structure in a data center, where the data center hallway structure is configured to house a plurality of equipment racks in a row extending longitudinally along a length thereof, and where a collective front side of the equipment racks help to define a cold aisle, and a collective rear side of the equipment racks help to define a hot aisle. The modular cooling unit may comprise a housing configured to be secured perpendicularly relative to the longitudinal axis of the unit IT structure. The housing may include a cold air discharge compartment at one end thereof, overlaying the cold aisle, from which cold air from the modular cooling unit is discharged into the cold aisle. The housing may further include a hot air intake compartment selectively located to overlay the hot aisle, into which hot air from the hot aisle is drawn. The housing may have a width sufficient to substantially span a full width of the one of the equipment racks, and a length sufficient to span at least substantially a full width of the unit IT structure.

In another aspect the present disclosure relates to a modular cooling unit adapted for use above a unit IT structure forming a data center hallway structure in a data center. The data center hallway structure is configured to house a plurality of equipment racks in a row extending longitudinally along a length thereof, and a collective front side of the equipment racks help to define a cold aisle, and a collective rear side of the equipment racks help to define a hot aisle. The modular cooling unit may comprise a housing configured to be secured perpendicularly relative to the longitudinal axis of the unit IT structure to fully span the unit IT structure. The housing may include a cold air discharge compartment at one end thereof, forming a first compartment, overlaying the cold aisle, from which cold air from the modular cooling unit is discharged into the cold aisle. The housing may also include a hot air intake compartment adjacent the cold air discharge compartment and forming a central compartment, and arranged to overlay the hot aisle into which hot air from the hot aisle is drawn. The housing may further include a second compartment arranged adjacent to the central compartment for receiving an airflow of ambient air from an ambient environment. The housing may have a width sufficient to span a full width of the one of the equipment racks and to form a ceiling over at least a portion of both the hot aisle and the cold aisle of the unit IT structure.

In still another aspect the present disclosure relates to an integrated, modular, data center hallway structure. The data center hallway structure may comprise a unit IT structure forming a framework for the data center hallway structure, and having dimensions suitable for accommodating a row of equipment racks. The equipment racks form a cold aisle on a collective front side thereof, and a hot aisle on a collective rear side thereof. A plurality of roof mounted, modular cooling units may also be included, with the units being positioned in side-by-side relationship and adapted to be secured to the unit IT structure perpendicularly to a length of the unit IT structure, to thus form a roof for a major portion of the unit IT structure. Each one of the roof mounted modular cooling units may include a housing. The housing may include a hot air intake compartment selectively located to overlay the hot aisle, into which hot air from the hot aisle is drawn. The housing may further include a cold air discharge compartment selectively located to overlay the cold aisle, from which cold air is blown into the cold aisle. The housing may have a width sufficient to substantially span a full width of the one of the equipment racks.

In still another aspect the present disclosure relates to a modular cooling unit adapted for use above a unit IT structure forming a data center hallway structure in a data center. The data center hallway structure is configured to house a plurality of equipment racks in a row extending longitudinally along a length thereof, and where a collective front side of the equipment racks help to define a cold aisle, and a collective rear side of the equipment racks help to define a hot aisle. The modular cooling unit may comprise a housing configured to be secured perpendicularly relative to the longitudinal axis of the unit IT structure to fully span the unit IT structure. The housing may include a first compartment and a second compartment. The first compartment may form a cold air discharge compartment at one end thereof, and may overlay the cold aisle, from which cold air from the modular cooling unit is discharged into the cold aisle. The second compartment may form a hot air intake compartment adjacent the cold air discharge compartment, and is arranged to overlay the hot aisle, into which hot air from the hot aisle is drawn. An air-to-water heat exchanger may be located in the second compartment for cooling the hot air passing through the second compartment into the first compartment. The housing may further have a width sufficient to span a full width of the one of the equipment racks and to form a ceiling over at least a portion of both the hot aisle and the cold aisle of the unit IT structure.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

DETAILED DESCRIPTION

Figure 1:
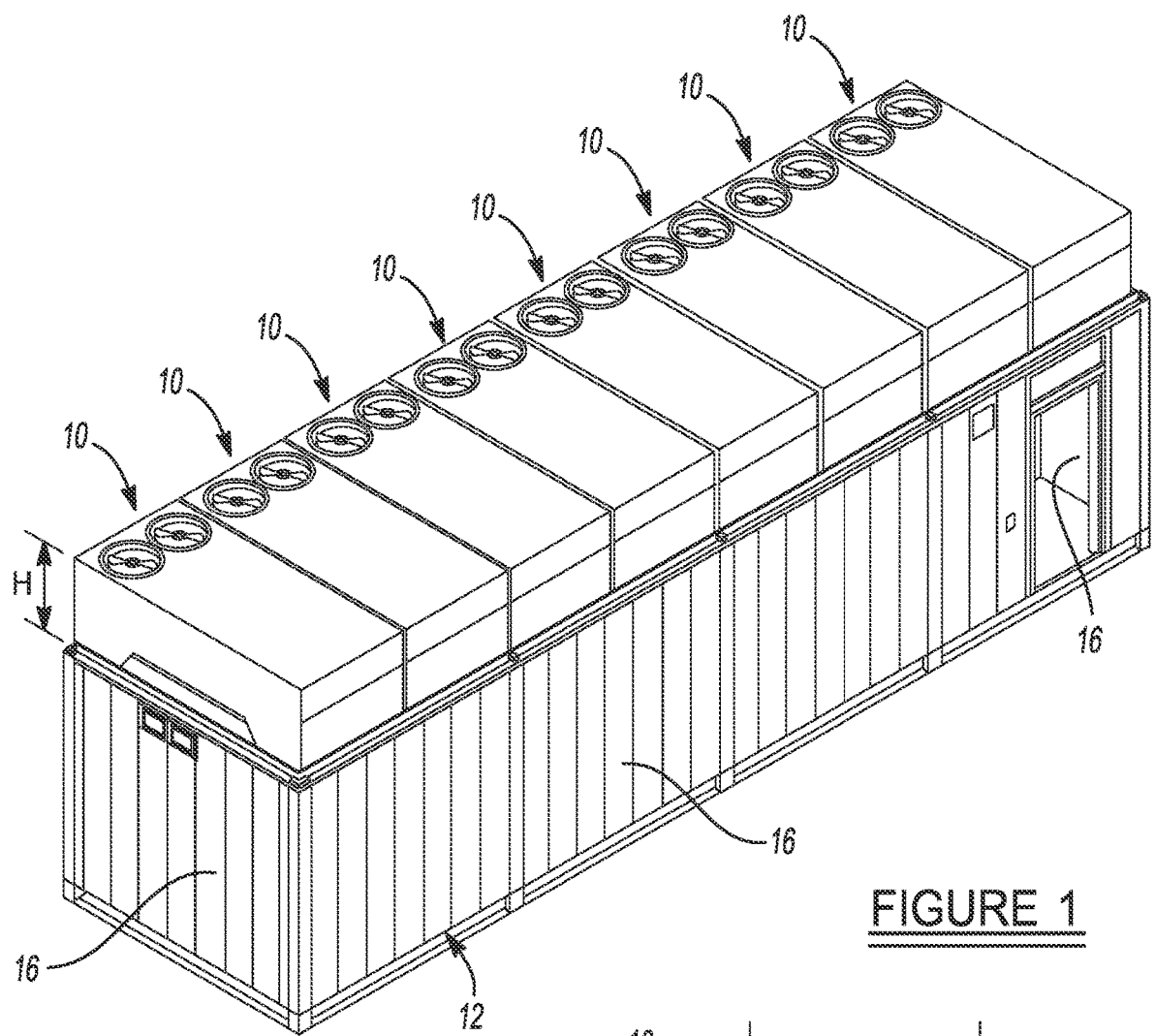
FIG. 1 is a perspective view of one embodiment of a modular data center unit IT structure incorporating a plurality of roof mounted modular cooling units, in accordance with the present disclosure, to fully cover a roof area of the unit IT structure.

The following description is merely exemplary in nature and is not intended to limit the present disclosure, application, or uses. It should be understood that throughout the drawings, corresponding reference numerals indicate like or corresponding parts and features.

Referring to FIG. 1, there is shown a plurality of roof mounted modular cooling unit systems 10 in accordance with the present disclosure, mounted on a modular data center unit IT structure 12 and forming a roof structure for the unit IT structure 12. Together, the roof mounted modular cooling unit systems 10 (hereinafter simply "RMC units 10") and the unit IT structure 12 form an integrated, modular, data center hallway structure. The RMC units 10 provide the additional advantage of structurally stiffening and strengthening a frame structure 14 and wall panels 16 of the unit IT structure 12, once fully attached to the unit IT structure. A plurality of the modular data hallway structures, when disposed adjacent one another, may form a much larger modular data center.

Figure 1A:
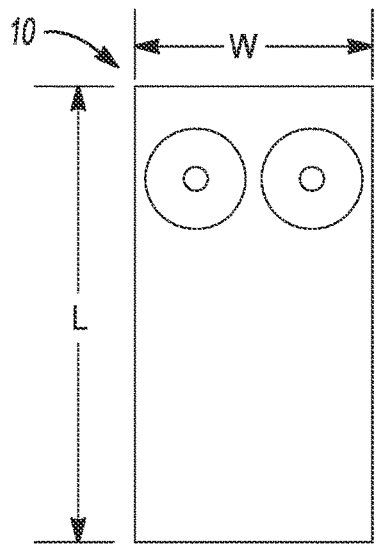
FIG. 1a is a high level plan view of one CWRMC unit illustrating length and width dimensions.

Referring further to FIGS. 1 and 1a, the overall dimensions of a single RMC unit 10 may be varied as needed to suit dimensions of a specific unit IT structure 12. In one example the RMC unit 10 may have dimensions of about 3.4 m in length (L), about 1.6 m in width (W), and about 0.8 m in height (H). While only a single row of RMC units 10 is shown in FIG. 1, a plurality of rows of the RMC units may be arranged adjacent one another, in one or both of the X and Y directions, to cover a much larger X-Y assembled grid of unit IT structures 12, to thus form a much larger overall data center. A particular advantage of the RMC unit 10 is that it can readily be used with additional unit IT structures 12 that are added to expand a data center after its initial construction. This helps to facilitate easy and cost effective expansion of the data center at a future date if the need for additional data center capacity becomes necessary. Alternatively, the RMC units 10 and the unit IT structure 12 may be fully assembled in a factory environment and packaged for shipping as a single, integrated, fully assembled, modular unit IT structure having virtually all needed electrical wiring, cooling conduits, cable trays, etc., needed for a fully functional data center hallway structure. Still further, if the RMC units 10 are physically secured to the unit IT structure 12 in a factory environment, then the entire assembly may have dimensions also enabling shipping and handling of the complete assembly in an intermodal or standardized ISO shipping container. Both implementations are contemplated by the present disclosure.

Figure 2:
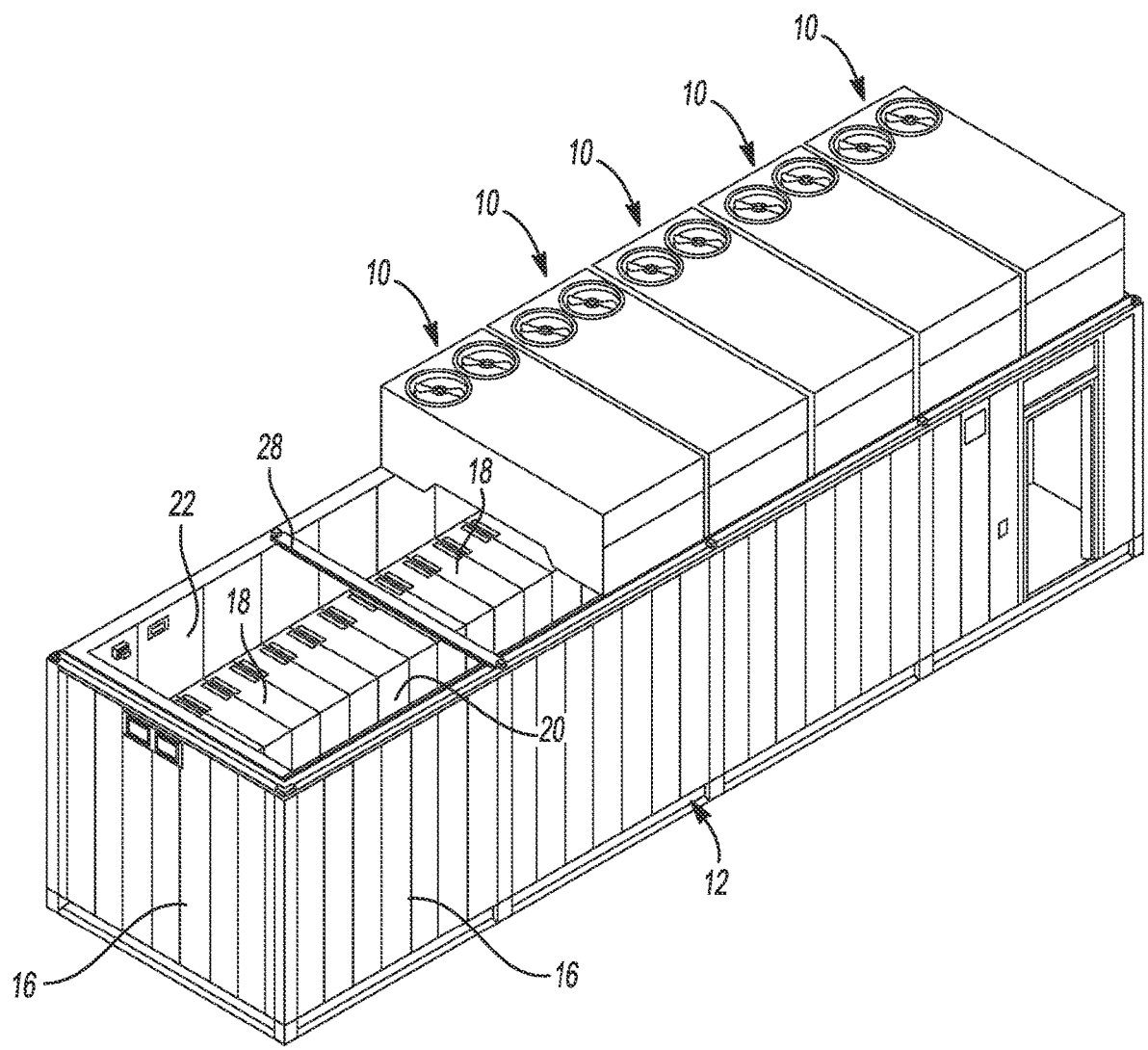
FIG. 2 is a perspective view of the data center unit IT structure of FIG. 1, but with several roof mounted cooling units of the data center unit IT structure removed to reveal the interior placement of equipment racks and the hot and cold aisles formed within the structure.
Figure 3:
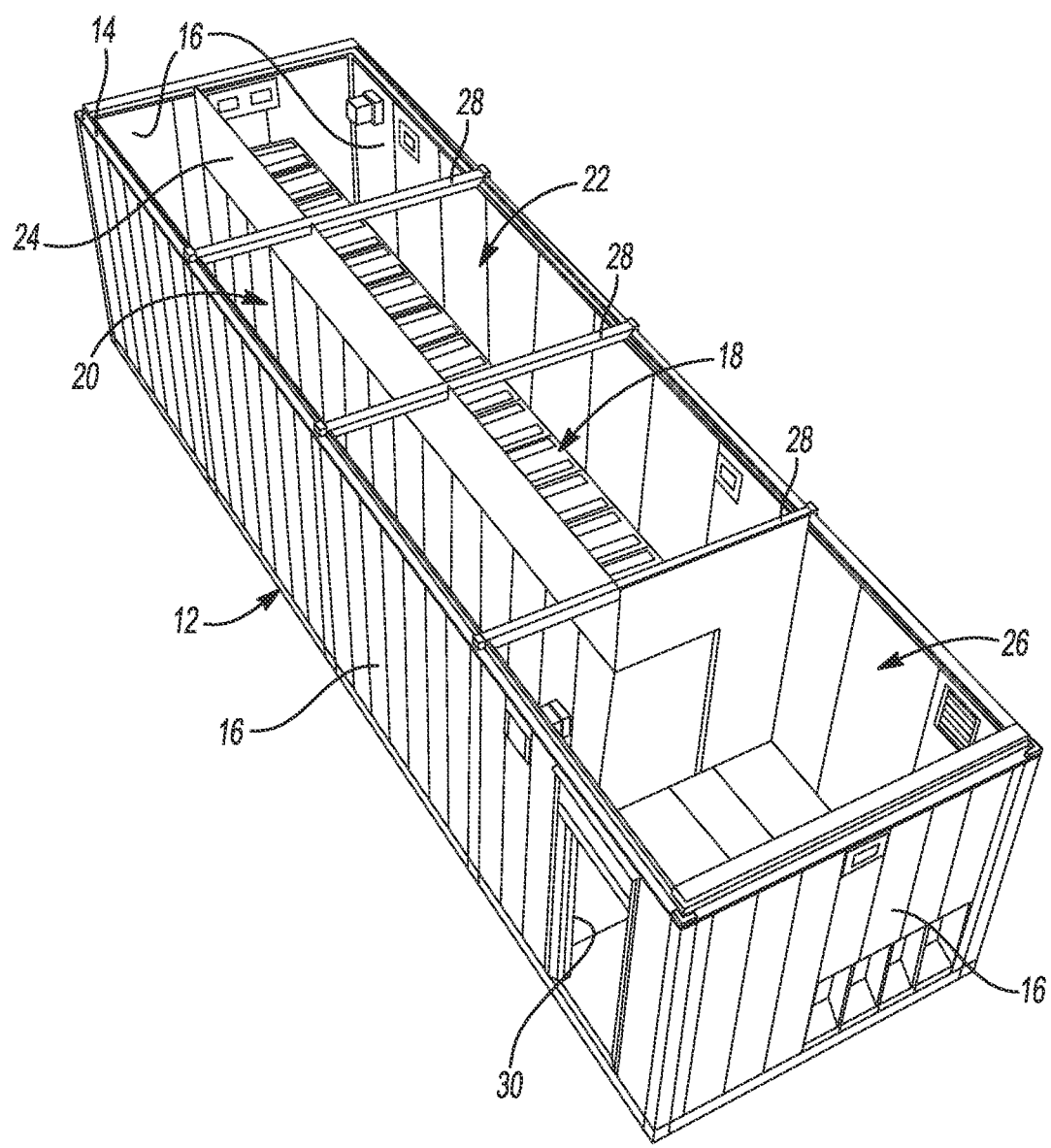
FIG. 3 illustrates the modular data center unit IT structure of FIG. 1 but with all of the roof mounted modular cooling units removed, to even more fully reveal the interior layout of components and interior wall components.

Referring to FIGS. 2 and 3, the internal configuration of a typical unit IT structure 12 and how the RMC unit 10 fits in relation to the unit IT structure can be seen. The unit IT structure 12 typically houses a plurality of equipment racks 18 arranged in a row. A front side of each of the equipment racks 18 face, and help to collectively form, what is termed a "cold aisle" 20, while a rear side of each of the equipment racks face, and collectively help to form, what is termed a "hot aisle" 22. With prior art unit IT configurations, typically a relatively large, floor mounted cooling unit is located at one end of the unit IT structure 12 and uses one or more fans to blow the cool air down the full length of the cold aisle 20 of the unit IT structure. Typically ductwork is needed to receive the warm air being exhausted from the rear side of each equipment rack into the hot aisle 22, which channels the hot air, typically with the assistance of a plurality of fans, back toward the cooling unit at one of end of the IT unit structure. Such a configuration is not needed with the RMCs 10.

As can also be seen in FIG. 3, typically the unit IT module 12 may also include a short vertical wall 24 extending along substantially the full length of the unit IT structure 12, with a small entry way room 26 being formed at one end of the unit IT structure. A door (not shown) would typically be secured over a doorway opening 30. One or more cross brace elements 28 may be secured to the frame portion 16 to help stiffen the frame portion and to help secure the RMC units 10 to the frame portion. A small area over the entry way room 26 may be covered with suitable ceiling tiles (not shown).

With further reference to FIG. 2, an important feature of the RMC units 10 is that they form a ceiling or roof for the unit IT structure 12. Each RMC unit 10 spans the full width of unit IT structure 12. The RMC units 10, with the help of the vertical wall 24, help to substantially fully partition the hot aisle 22 from the cold aisle 20 so that no cold air is able to flow above the equipment racks 18 into the hot aisle, and conversely no hot air from the hot aisle 22 is able to escape back into the cold aisle 20.

Figure 4:
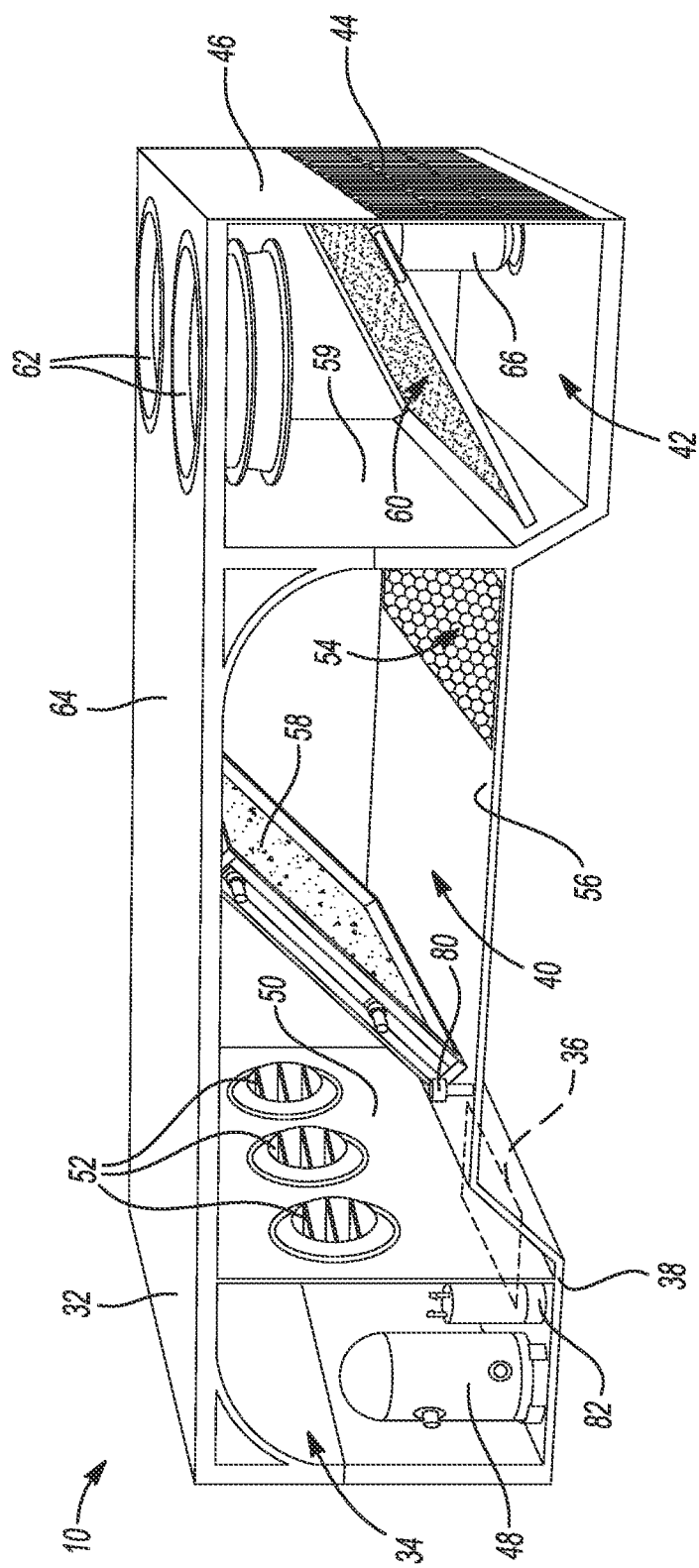
FIG. 4 shows a perspective cross sectional side view of one of the modular cooling units illustrating the placement of components therein for enabling the roof mounted modular cooling unit to operate as an air-to-air cooling unit which is able to communicate with both of the hot and cold aisles, once in position over the hot and cold aisles.

Referring to FIG. 4, the construction of one of the RMC units 10 is shown in greater detail. The RMC unit 10 in this example forms an air-to-air refrigeration unit (sometimes referred to in the art as a "chiller"). A generally rectangular housing 32 includes a first compartment 34 forming a "cold air discharge compartment". Cold air is discharged from the first compartment 34 through a cold air discharge grille 36 in a bottom wall portion 38 of the first compartment 34 into the cold aisle 20. A central compartment 40 forms a "hot air intake compartment" and is positioned immediately adjacent the first compartment 34. The central compartment 40 receives hot air from the hot aisle 22. A second compartment 42 is positioned adjacent the central compartment 40 and includes an ambient air inlet grille 44 in an end wall portion 46 of the housing 32, through which ambient air from an external ambient environment may be drawn into the second compartment 42.

With further reference to FIG. 4, the first compartment 34 may house at least one refrigerant compressor 48, which in one implementation may be a digital scroll compressor. A wall portion 50 which separates the first compartment 34 from the central compartment 40 may support one or more fans 52 positioned over corresponding openings in the wall portion 50. The fans 52 may be used to draw hot air through a hot air inlet grille 54 in a bottom wall 56 of the central compartment 40 of the housing 32, and then through an evaporator 58. The hot air is cooled as it passes through the evaporator 58 and turned into cold air before being drawn by the fans 52 into the first compartment 34, and then discharged into the cold aisle 20 as cold air.

Referring further to FIG. 4, the second compartment 42, as noted above, is sealed from the central compartment 40 and from the interior of the unit IT structure 12 by a wall portion 59. Ambient air may be drawn in through the ambient air intake grille 44 and over a condenser 60 by one or more fans 62 mounted in an upper wall 64 of the housing 32. A liquid receiver 66 may be mounted in the second compartment 42, and located between an outlet of the condenser 60 and an inlet for an expansion device 80 in the refrigerant flow path. The liquid receiver 66 may not be needed in all implementations of the RMC unit 10, but if included it ensures that liquid refrigerant enters the expansion device 80 across a range of conditions where refrigerant charge can migrate from one area of the overall refrigeration system to another. It will also be appreciated that while specific flow conduits have not been illustrated between the compressor 48, the evaporator 58 and the condenser 60 to avoid unnecessarily cluttering the figure, that the suction line (input) of the compressor will be in communication with an outlet of the evaporator, and an outlet of the compressor 48 will be in communication with an inlet of the condenser, as is typical with refrigeration systems. An oil separator 82 is preferably installed close to the compressor 48, which separates oil after the compression process. Depending on the specific type of refrigeration system employed in the RMC unit 10, the oil separator 82 may not be needed in all implementations.

Figure 5:
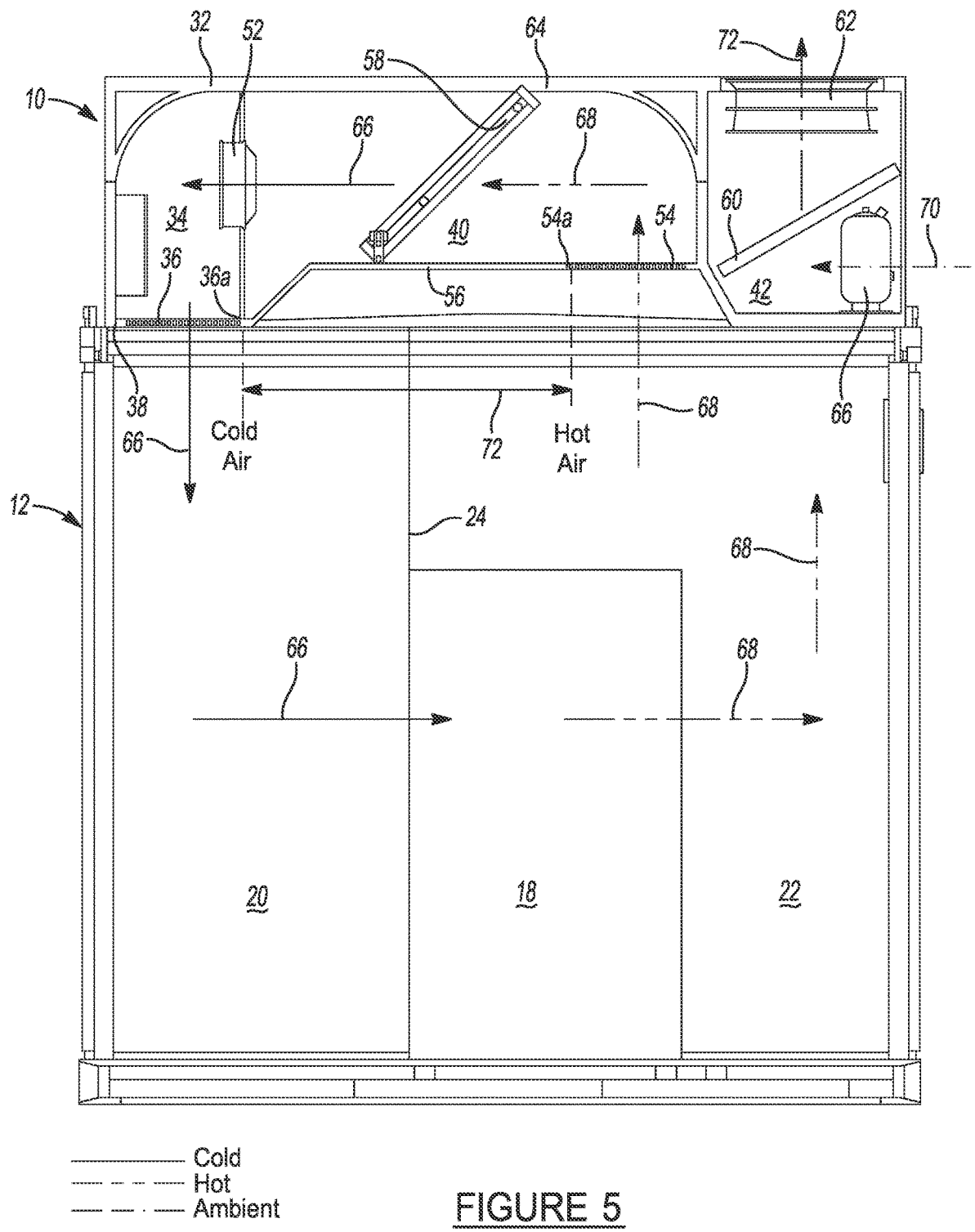
FIG. 5 is a simplified diagrammatic end view of the modular data center unit IT structure showing one roof mounted modular cooling unit disposed laterally above the hot and cold aisles, along with airflows to indicate how hot and cold air flows in a closed loop bath between the cold aisle, the equipment racks, the hot aisle and the modular cooling unit, together with showing how the modular cooling unit eliminates the need for hot air ductwork above the hot aisle.

The hot and cold air flow paths flowing through the RMC unit 10 are also shown in FIG. 5. Cold airflows are denoted with reference numeral 66 and hot air flows are denoted with reference numeral 68. An ambient airflow 70 is also illustrated entering the second compartment 42 and flowing through the condenser 60, after which it is discharged as a warm airflow 72 by fans 62.

From FIG. 5, it is also important to note that a spacing between the hot air inlet grille 54 and the cold air discharge grille 36 is selected to ensure that cold air discharge grille 36 is positioned over the cold aisle 20 and the hot air inlet grille 54 is positioned over the hot aisle 22. Put differently, these two airflow grilles 36 and 54 are preferably located such that they are generally adjacent the front and rear sides of the equipment racks 18. If an industry standard EIA 42U server rack is being used as the equipment rack 18, then such a server rack will have an overall width of about 19", an overall height of about 78.74" and an overall depth of at least about 39.37". In this example, then, a facing edge 36a of the cold air discharge grille 36 and a facing edge 54a of the warm air inlet grille 54 may be separated, in one implementation, by a distance of preferably about 39.37", as indicated by arrow 72 in FIG. 5. The spacing of the grilles 36 and 54 may vary from this dimension, however, but preferably they are both positioned relatively closer to the front and rear sides of the equipment racks 18, which will help facilitate cold airflow into the front sides of the equipment racks 18, and hot air out from the rear sides of the equipment racks 18 into the hot air inlet grille 54 of each RMC unit 10. From the above discussion it will be appreciated that the spacing of the cold air discharge grille 36 and the hot air inlet grille 54 may need to be tailored slightly depending on the specific type of equipment rack being used, and/or the width dimensions of the cold aisle 20 and the hot aisle 22.

Figure 6:
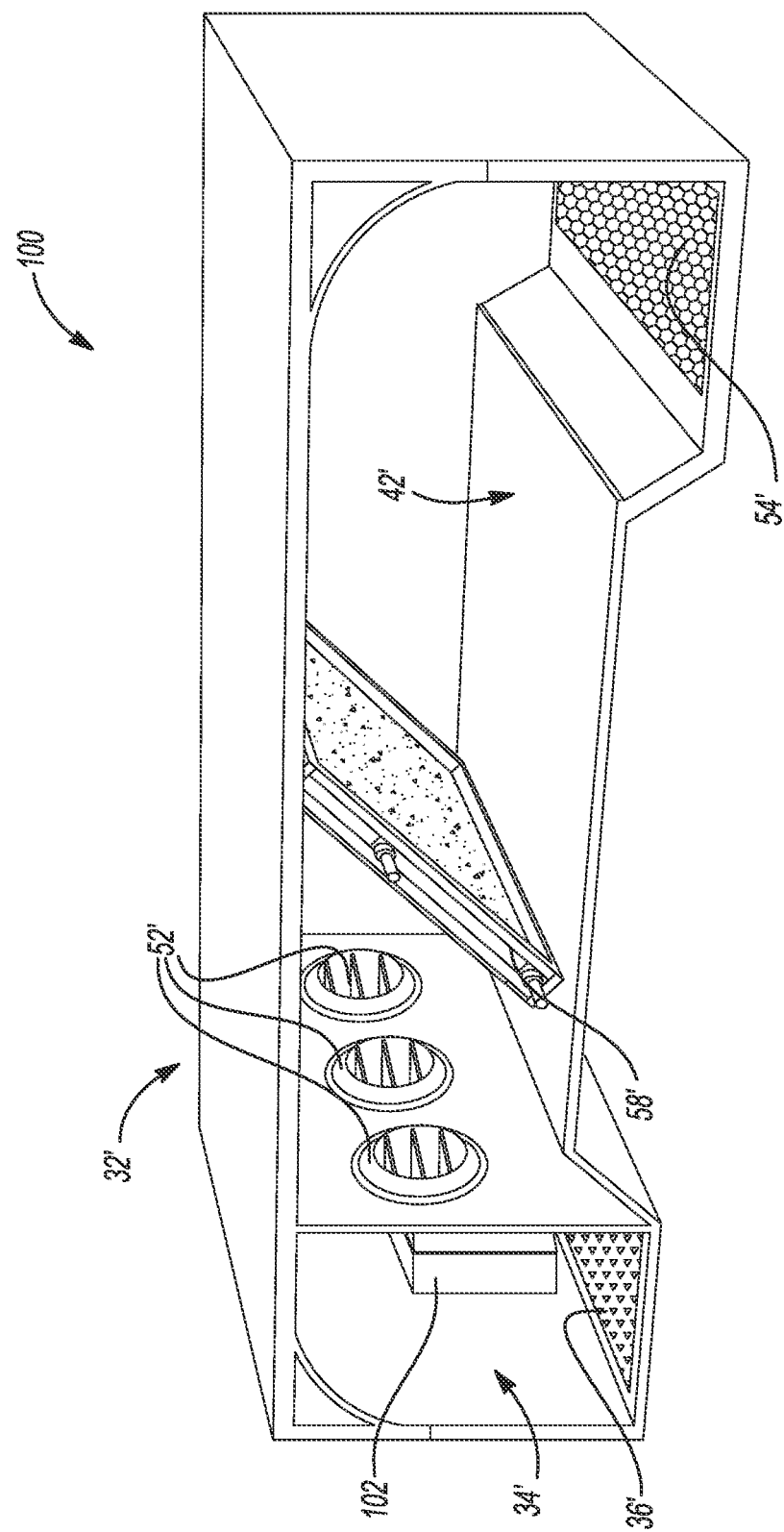
FIG. 6 is a perspective cross sectional side view of another embodiment of the roof mounted modular cooling unit, which in this example forms an air-to-water cooling unit.

Referring to FIG. 6, a chilled water (and ethylene-glycol water mixture EGW or propylene-glycol water mixture PGW), roof mounted cooling (CWRMC) unit 100 in accordance with another embodiment of the present disclosure is shown. The CWRMC unit 100 forms an air-to-water heat exchanger system, with the construction of the CWRMC unit 100 being similar to the RMC unit 10. With the CWRMC unit 100, however, no refrigerant compressor is needed, and instead of an evaporator an air-to-water heat exchanger 58' is included. Components in common with the RMC unit 10 have been labelled with similar reference numbers used to describe the RMC unit 10 but with a prime indication ('). The overall dimensions of the CWRMC unit 100 may be similar or even identical to the RMC unit 10.

In addition, the CWRMC unit 100 may have a warm air inlet grille 54', and in the example shown in FIG. 6, the warm air inlet 54' is located at one far end of the housing 32', which helps to simplify access to the interior of the CWRMC unit 100. However, the warm air inlet 54' need not be located at the extreme far end of the CWRMC unit 100, and may be located more inboardly such as with the RMC unit 10. The CWRMC unit 100 in this embodiment has the first compartment 34' configured to be in direct airflow communication with the second compartment 42', wherein the first compartment 34' forms a cold air discharge compartment, and the second compartment 42' forms a hot air intake compartment. In this regard, the housing 32' includes only two distinct compartments rather than the three compartments of the RMC unit 10. An electrical panel 102 is positioned within the first compartment 34'. Fans 52' draw hot air into the second compartment 42' and through the heat exchanger 58'. The hot air is cooled as it passes through the coils of the heat exchanger 58' and is then discharged as cold air through the cold air discharge grille 36' into the cold aisle 20.

It is a principal feature of the RMC unit 10 and the CWRMC unit 100 that both units are readily retrofittable into existing data center structures with little or no modification required to the units 10 and 100 or to the existing data center walls. The modular configuration of the RMC unit 10 and the CWRMC unit 100 enable these units to be located over new aisleways which have been added on to an existing data center facility. The added advantage of the RMC 10 and the CWRMC 100 forming a roof structure for the aisleway also substantially eliminates the need, and cost, for a separate roof structure over all or a significant portion of the equipment rack aisleway.

Yet another advantage of the modular feature of the RMC unit 10 and the CWRMC unit 100 is that when a plurality of the units is located over a given equipment aisle, if any one of the units requires periodic maintenance or repair, it may be possible to cool the equipment row using the remaining operating units 10 and/or 100 for a short while, while a single one of the units 10 and/or 100 is being serviced. This may not be possible with a conventional cooling unit disposed at one end of an equipment aisle, where all cooling to the aisle would need to be interrupted if the cooling system needs to be shut down for maintenance or repair.

Still another advantage of the RMC unit 10 and the CWRMC unit 100 is that the cooling capacity of each unit can be tailored to the anticipated requirements for cooling a single equipment rack 18, or alternatively for cooling two or more side-by-side equipment racks. In this regard, either one of the RMC unit 10 or the CWRMC unit 100 may be configured with dimensions sufficient to span two or more side-by-side equipment racks, and with sufficient cooling capacity to cool two or more equipment racks 18. Thus, while the figures illustrate the RMC unit 10 and the CWRMC unit 100 having width dimensions for spanning the width of a single equipment rack 18, the units 10 or 100 are not limited to a construction which enables cooling only a single equipment rack, but may instead be configured with the necessary dimensions and cooling capacity to accommodate cooling two or more equipment racks if desired.

It will also be appreciated that the RMC unit 10 (i.e., forming an air-to-air refrigeration unit), is not limited to use with any one specific refrigerant. The RMC unit 10 may be designed based on any presently known refrigerant, or possibly even alternative refrigerants yet to be developed and/or used in commercial air-to-air refrigeration units. The design of the RMC unit 10 supports the use of HydroFluoroCarbon (HFC) refrigerants, HydroFluroOolefin (HFO) refrigerants, HFO/HFC blends or Zeotropic mixtures, and will support virtually any other refrigerant in the refrigeration circuit of a refrigeration unit.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A modular cooling unit adapted for use above a unit IT structure forming a data center hallway structure in a data center, wherein the data center hallway structure is configured to house a plurality of equipment racks in a row extending longitudinally along a length thereof to define a longitudinal axis of the unit IT structure, and wherein a collective front side of the equipment racks help to define a cold aisle, and a collective rear side of the equipment racks help to define a hot aisle, the modular cooling unit comprising:
    a housing configured to be secured perpendicularly relative to the longitudinal axis of the unit IT structure;
    the housing including:
        a cold air discharge compartment at one end thereof, overlaying the cold aisle, from which cold air from the modular cooling unit is discharged into the cold aisle;
        a hot air intake compartment selectively located to overlay the hot aisle, into which hot air from the hot aisle is drawn;
        a width sufficient to substantially span a full width of one of the equipment racks; and
        a length sufficient to span at least substantially a full width of the unit IT structure to enable the housing to be supported by a pair of vertical wall portions of the unit IT structure, and to form a portion of a roof for the unit IT structure; and
    wherein the cold air discharge compartment forms a first compartment, the hot air intake compartment forms a central compartment immediately adjacent the first compartment, and wherein the modular cooling unit further includes:
        a second compartment immediately adjacent the central compartment; and
        a condenser housed within the second compartment.

2. The modular cooling unit of claim 1, wherein the length of the housing is sufficient to span the full width of the unit IT structure.

3. The modular cooling unit of claim 1, wherein the width of the housing is sufficient to cover the full width of the one of the equipment racks when positioned perpendicularly to the longitudinal axis of the unit IT structure.

4. The modular cooling unit of claim 1, wherein the modular cooling unit comprises an air-to-air refrigeration system.

5. The modular cooling unit of claim 1, further comprising a liquid receiver unit disposed in the second compartment and being in communication with the condenser.

6. The modular cooling unit of claim 1, wherein the second compartment further includes:
    an ambient air inlet grille for admitting ambient air into the second compartment; and
    wherein the housing includes at least one fan in communication with the second compartment for assisting in drawing in the ambient air into the second compartment.

7. The modular cooling unit of claim 1, further comprising:
    a wall separating the cold air discharge compartment and the hot air intake compartment; and
    at least one fan disposed in an opening in the wall for assisting in drawing the cold air into the cold air discharge compartment.

8. A modular cooling unit adapted for use above a unit IT structure forming a data center hallway structure in a data center, wherein the data center hallway structure is configured to house a plurality of equipment racks in a row extending longitudinally along a length thereof to define a longitudinal axis of the unit IT structure, and wherein a collective front side of the equipment racks help to define a cold aisle, and a collective rear side of the equipment racks help to define a hot aisle, the modular cooling unit comprising:
    a housing configured to be secured perpendicularly relative to the longitudinal axis of the unit IT structure to fully span the unit IT structure;
    the housing including:
        a cold air discharge compartment at one end thereof, forming a first compartment, overlaying the cold aisle, from which cold air from the modular cooling unit is discharged into the cold aisle;
        a hot air intake compartment adjacent the cold air discharge compartment and forming a central compartment, and arranged to overlay the hot aisle into which hot air from the hot aisle is drawn;

a second compartment arranged adjacent to the central compartment for receiving an airflow of ambient air from an ambient environment; and the housing further having a width sufficient to span a full width of one of the equipment racks and to form a ceiling over at least a portion of both the hot aisle and the cold aisle of the unit IT structure, to enable the housing to be supported by a pair of vertical wall portions of the unit IT structure, and to form a portion of a roof for the unit IT structure.

9. The modular cooling unit of claim 8, wherein the modular cooling unit comprises an air-to-air refrigeration system.

10. The modular cooling unit of claim 8, wherein the width of the housing is about the same as a width of each one of the equipment racks, and a length sufficient to span a width of the unit IT structure.

11. The modular cooling unit of claim 8, wherein the modular cooling unit comprises a plurality of modular cooling units, when placed in a side-by-side arrangement on the unit IT structure, form a ceiling for the unit IT structure.

12. The modular cooling unit of claim 8, wherein:
the first compartment includes a cold air discharge grille through which the cold air is discharged from the modular cooling unit into the cold aisle;
the central compartment includes a hot air inlet grille through which the hot air is ingested into the modular cooling unit from the hot aisle; and
the second compartment is isolated from the central compartment.

13. The modular cooling unit of claim 12, wherein:
a spacing of the cold air discharge grille and the hot air inlet grille is selected such that the cold air discharge grille resides over the cold aisle and adjacent a front side of an associated one of the equipment racks into which cold air is ingested; and
the hot air inlet grille resides over the hot aisle and adjacent a rear side of the associated one of the equipment racks from which hot air is exhausted.

14. The modular cooling unit of claim 8, wherein the second compartment includes a condenser and a fan for drawing in the ambient air over the condenser.

15. The modular cooling unit of claim 8, further comprising a compressor located in the first compartment.

16. An integrated, modular, data center hallway structure, the structure comprising:
a unit IT structure forming a framework for the data center hallway structure, and having dimensions suitable for accommodating a row of equipment racks, which form a cold aisle on a collective front side of the equipment racks and a hot aisle on a collective rear side of the equipment racks;
a plurality of modular cooling units positioned in side-by-side relationship and adapted to be secured to the unit IT structure perpendicularly to a length of the unit IT structure, to form a roof for a major portion of the unit IT structure;
each one of the modular cooling units including a housing, the housing including:
a central compartment operating as a hot air intake compartment selectively located to overlay the hot aisle, into which hot air from the hot aisle is drawn;
a first compartment disposed adjacent a first side of the central compartment and selectively located to overlay the cold aisle, from which cold air is blown into the cold aisle;
a second compartment adjacent a second side of the central compartment opposite the first side of the central compartment, and a condenser disposed in the second compartment; and
a width sufficient to substantially span a full width of the one of the equipment racks to enable the housing to be supported by a pair of vertical wall portions of the unit IT structure and to help form the roof.

17. The data center hallway structure of claim 16, wherein each of the modular cooling units comprises at least one of:
an air-to-air based cooling system; and
an air-to-water based cooling system.

* * * * *